United States Patent [19]
Eggermont et al.

[11] Patent Number: 4,580,237
[45] Date of Patent: Apr. 1, 1986

[54] DIGITAL TONE CONTROL ARRANGEMENT

[75] Inventors: Ludwig D. J. Eggermont; Petrus J. Berkhout, both of Eindhoven, Netherlands

[73] Assignee: U.S. Philips Corporation, New York, N.Y.

[21] Appl. No.: 468,213

[22] Filed: Feb. 22, 1983

[30] Foreign Application Priority Data

Mar. 31, 1982 [NL] Netherlands ............... 8201344

[51] Int. Cl.$^4$ .............................................. G06F 7/38
[52] U.S. Cl. ........................................................ 364/724
[58] Field of Search ........................................... 364/724

[56] References Cited

U.S. PATENT DOCUMENTS

| | | | |
|---|---|---|---|
| 3,619,586 | 11/1971 | Hoff, Jr. et al. | 364/724 |
| 4,034,196 | 7/1977 | Butterweck et al. | 364/724 |
| 4,117,541 | 9/1978 | Ali | 364/724 |
| 4,223,389 | 9/1980 | Amada et al. | 364/745 |
| 4,305,133 | 12/1981 | Amada et al. | 364/724 |
| 4,322,810 | 3/1982 | Nakayama | 364/724 |
| 4,422,156 | 12/1983 | Sano | 364/724 |
| 4,467,440 | 8/1984 | Sano et al. | 364/724 |
| 4,489,391 | 12/1984 | Morikawa | 364/724 |

OTHER PUBLICATIONS

McNally: "Microprocessor Mixing and Processing of Digital Audio Signals"; *Journal of the Audio Engineering Society*, vol. 27, No. 10, pp. 793–803, Oct. 1979.
Hirata: "Digitalization of Conventional Analog Filters for Recording Use"; *Journal of the Audio Engineering Society*, vol. 29, No. 5, pp. 333–337; May 1981.
Oppenheim et al.: *Digital Signal Processing*; Inc. (1975), Prentice Hall.
Rabiner et al.: "Terminology in Digital Signal Processing"; *IEEE Trans. on Audio and Electroacoustics*, vol. AU-20, pp. 322–337, Dec. 1972.

*Primary Examiner*—James D. Thomas
*Assistant Examiner*—Dale M. Shaw
*Attorney, Agent, or Firm*—Thomas A. Briody; William J. Streeter; Marianne Rich

[57] ABSTRACT

Digital tone control arrangement for a digital audio signal, comprising a recursive digital filter whose transfer function contains as many poles as there are zeros, the recursive filter also comprising a recursive portion and a non-recursive portion each receiving filter coefficients which are stored in a memory means. So as to limit the total number of filter coefficients the memory means is divided into a first memory field for storing a first sub-group of filter coefficients and into a number of second memory fields in each of which a second subgroup of filter coefficients is stored. By means of a switching device the first subgroup of the filter coefficients is applied either to the non-recursive portion or to the recursive portion and a selected second subgroup of filter coefficients is applied to that portion (recursive and the non-recursive) to which the first subgroup of filter coefficients is not applied.

6 Claims, 5 Drawing Figures

DIGITAL TONE CONTROL ARRANGEMENT

BACKGROUND OF THE INVENTION

1. Field of the Invention

The invention relates to an arrangement for controlling the amplitude and the phase of frequency components of an audio signal which is available in digital form, the frequency components being located in a predetermined frequency band. Such an arrangement is suitable for use as a bass control circuit, as a treble control circuit, or as an equalizing circuit, and will be denoted a digital tone control arrangement hereinafter.

2. Description of the Prior Art

In audio apparatus generally, an analogue audio signal is processed whose frequency spectrum is located in the audio frequency band from approximately 0 Hz to approximately 20 kHz and which is converted into an acoustic signal via a loudspeaker. The energy in this acoustic signal is, however, highly dependent on the acoustic impedance of the enclosure in which the loudspeaker is accommodated. As this impedance has a frequency-dependent behaviour, the energy in the acoustic signal depends on the amplitude and the phase of the different frequency components of the analogue audio signal.

In order to prevent certain frequency components in the audio signal from making too small a contribution to the acoustic signal, this analogue audio signal is applied to the loudspeaker via a tone-control arrangement. This tone control arrangement may be of such a construction that therein the amplitude and phase of those frequency components of the analogue audio signal which are located in the frequency band from for example, 0 Hz to approximately 300 Hz can be reinforced or attenuated with respect to the remaining components. This is called bass control. Alternatively, this tone control arrangement may be of such a construction that therein the amplitude and the phase of those frequency components of the analogue audio signal which are located in the frequency band from for example, approximately 300 Hz to 20 kHz can be reinforced or attenuated with respect to the remaining components. This alternative is called treble control. Also in contemporary audio apparatus tone control arrangements are used which are of such a construction that therein the amplitude and phase of those frequency components of the analogue audio signal which are located within a particular frequency band of a given width within the audio frequency band are reinforced or attenuated with respect to the remaining components; this is called spectrum equalization. Typically, to equalize the frequency spectrum, the overall audio frequency band is divided into a plurality of consecutive sub-bands each having a width of, for example, approximately 1 kHz and a tone control arrangement is then provided for each sub-band.

In known tone control arrangements which are arranged for processing an analogue audio signal, the desired reinforcing or attenuation of frequency components is realized by changing the resistance value of a resistance network. Thus, such a tone control arrangement has a transfer characteristic which depends on the resistance value of this variable resistance network. Hereinafter, this will be expressed by assuming that a family of transfer characteristics is associated with the tone control arrangement.

In the past few years the interest in the digitalization of analogue signals has generally greatly increased. This interest has also penetrated into the audio field. Already some years ago, efforts were successfully made to digitize an analogue audio signal, more specifically a musical signal, and to record it in digital form on a magnetic tape and even on a record. By means of a digital read arrangement the information present on the tape or on the record is converted into a digital audio signal which can be converted into the original analogue audio signal by means of a digital-to-analogue converter. A tone control can be applied in the above-described manner to this audio signal.

Each of the references 1 and 2 describes a digital tone control arrangement with which the desired tone control is obtained by performing processing operations on the digital audio signal. This arrangement comprises a recursive digital filter to which the digital audio signal is applied and which incorporates a recursive portion and a non-recursive portion. General information on digital filters and digital signal processing can be found in Reference 3, while the terminology relating to digital signal processing is contained in Reference 4. As is, for example, described in these References 3 and 4, both the recursive portion and the non-recursive portion of a recursive digital filter comprises a plurality of delay elements and a plurality of multipliers.

A main group of filter coefficients is associated with the recursive digital filter, that is to say a multiplying factor, alternatively denoted a filter coefficient, is applied to each multiplier. Together, these multiplying factors form this main group. Such a main group can be split into a first and a second subgroup, which, as is indicated in the References 1 and 2 must each comprise the same number of filter coefficients. The coefficients of the first subgroup are, for example, applied to the multipliers in the non-recursive portion and the coefficients of the second subgroup are applied to the multipliers of the recursive portion. Thus, the first subgroup determines the location of the zeros of the transfer function of the digital filter and the second subgroup then determines the locations of the poles of these transfer functions (see also Reference 3, chapter 4). When the location of the poles and the zeros of the transfer function are known, the transfer characteristic of the recursive digital filter and consequently also of the tone control arrangement are then fully known. As a family of transfer characteristics must be realized with the digital tone control arrangement, as also with its analogue counterpart, a main group of filter coefficients must be available for each transfer characteristic. It is then customary to use in the tone control arrangement a memory means having a number of addressable memory fields. A main group of filter coefficients is stored in each memory field. More specifically, each memory field has a number of memory locations which are each arranged to store a filter coefficient of the relevant main group. The required addresses for the addressable memory fields are generated by an address generator which can be operated by a user of the audio apparatus by means of control elements.

From the foregoing, it will be obvious that the number of memory locations required is directly proportional to the number of filter coefficients in a main group and to the number of transfer characteristics to be realized.

SUMMARY OF THE INVENTION

The invention has for its object to provide in a digital tone control arrangement which comprises in the above-described manner:
- a recursive digital filter to which a digital audio signal is applied, which has a recursive portion and a non-recursive portion and with which a number of main groups of filter coefficients are associated which are each divided into a first and a second subgroup of filter coefficients each having the same number of filter coefficients; and
- a memory means for storing the main groups of the filter coefficients;

a reduction of the total number of required filter coefficients and consequently the number of memory locations required in the memory means without decreasing the number of transfer characteristics which are to be realized.

According to the invention, the memory means is divided into a first memory field for storing only one single first subgroup of filter coefficients and into a number of second memory fields in each of which a respective second subgroup of filter coefficients is stored; in addition, this tone control arrangement comprises means for applying the first subgroup of filter coefficients stored in the first memory field either to the non-recursive portion or to the recursive portion and for applying a second subgroup of the coefficients to that portion to which the first subgroup of filter coefficients is not applied.

On the one hand the invention is based on the idea that a family of gain characteristics which is very suitable for practical usage can be obtained by varying the poles after a fixed choice of the zeros of the transfer function. At the same time the invention is based on the idea that a family of attenuation characteristics which is very suitable for practical usage can be obtained by mirror inverting the family of gain characteristics around the zero axis; this is the axis which corresponds to a reinforcement of 0 DB. If now a predetermined gain characteristic is described by the transfer function of $H(z) = [D(z)]/[N(z)]$, then the attenuation characteristic which is obtained by mirror-inverting this gain characteristic around the zero axis can be described by the transfer function of $H'(z) = 1/[H(z)] = [N(z)]/[D(z)]$. From this it follows that the zeros of $H(z)$ coincide with the poles of $H'(z)$ and that inversely the poles of $H(z)$ coincide with the zero points of $H'(z)$. Thus, by assigning a fixed value to the zeros of $H(z)$ and by varying its poles a certain family of gain characteristics is obtained. If this situation is reversed and the poles of $H'(z)$ are made to coincide with the zeros of $H(z)$, by varying the zeros of $H'(z)$ and have them coincide with the poles of $H(z)$, a family of attenuation characteristics is obtained which is identical to said certain family of gain characteristics but which are mirror-inverted versions thereof relative to the zero axis.

REFERENCES

1. Microprocessor Mixing and Processing of Digital Audio Signals; G. W. McNally; Journal of the Audio Engineering Society, Vol. 27, No. 10, October 1979, pages 793–803.
2. Digitalization of Conventional Analog Filters for Recording Use; Y. Hirata; Journal of the Audio Engineering Society, Vol. 29, No. 5, May 1981, pages 333–337.
3. Digital Signal Processing; A. V. Oppenheim, R. W. Schafer, Prentice-Hall, INC (1975), (ISBN 0-13-214635-5).
4. Terminology in Digital Signal Processing; L. R. Rabiner et al. IEEE Transactions on Audio and Electroacoustics, Vol. AU-20, December 1972, pages 322–337.

SHORT DESCRIPTION OF THE FIGURES

DESCRIPTIONS OF THE EMBODIMENTS

Figure 1:
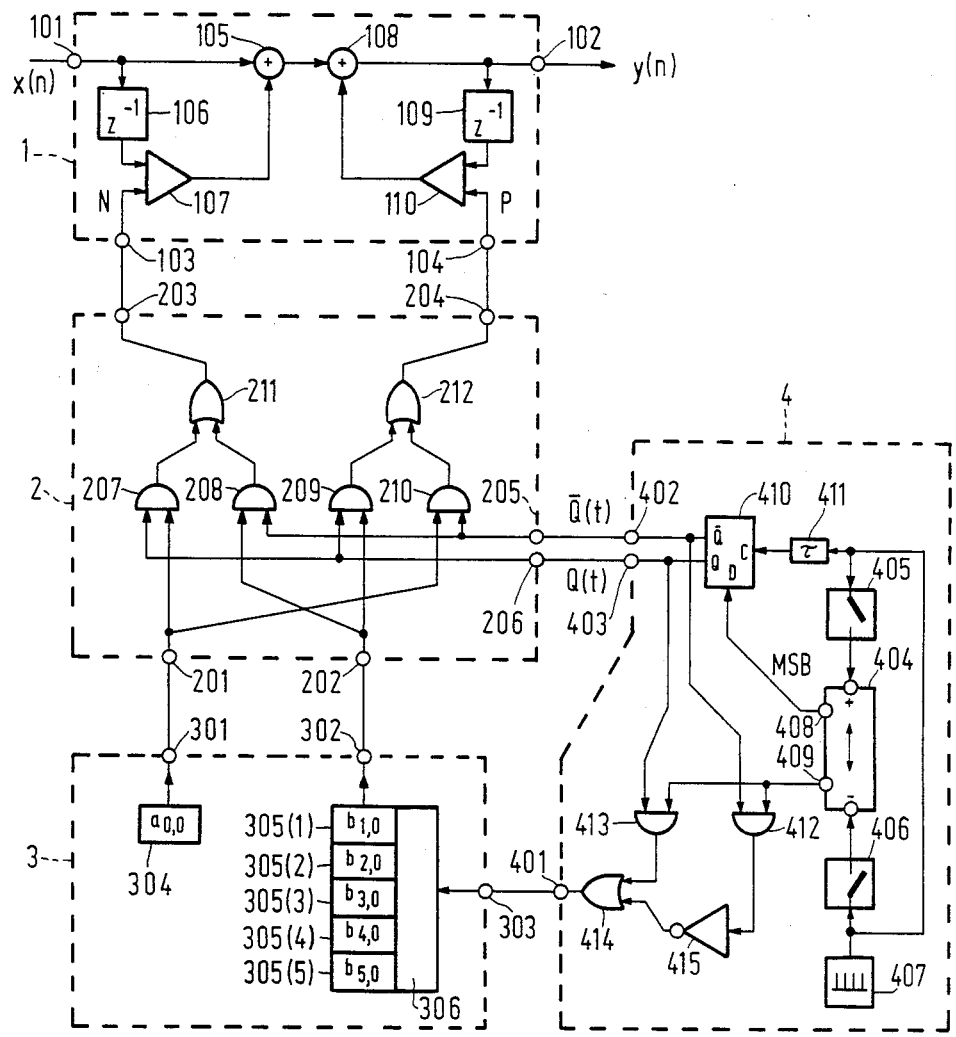
FIG. 1 shows a first embodiment of a digital tone control arrangement for bass or treble control.

FIG. 1 shows a first embodiment of a digital tone control arrangement. It comprises a recursive digital filter 1, a switching device 2, a memory means 3 and a control circuit 4. Let it be assumed that this tone control arrangement is intended for bass or treble control of an audio signal $x(n)$ which is applied in digital form. In that case, the order of the digital filter 1 may be chosen to be equal to unity, so that the z-transformed transfer function $H(z)$ of this filter is proportional to $(z+a)/(z-b)$ and consequently has one zero point, namely for $z = -a$ and one pole, namely for $z = +b$.

As is generally known from the theory of digital signal processing (see for example the References 3 and 4), such a transfer function can be realized by means of digital filters implemented in very diverse manners. The digital filter 1 shown in FIG. 1 has a signal input 101, a signal output 102, and coefficient inputs 103 and 104. The digital audio signal $x(n)$ is applied to the signal input 101 and the filtered digital audio signal $y(n)$ occurs at the signal output 102. This digital filter comprises a first adder 105, a first delay device 106 and a first multiplier device 107. The circuit formed by these elements represents the non-recursive portion of the recursive digital filters. In addition to this non-recursive portion this recursive digital filter has a recursive portion comprising a second adder 108, a second delay device 109 and a second multiplier device 110. The delay devices 106 and 109 each have a time delay equal to the sampling period which is associated with the digital audio signal $x(n)$. An input of the first multiplier device 107 is connected to the coefficient input 103 to receive a filter coefficient N. An input of the second multiplier device 110 is connected to the coefficient input 104 to receive a filter coefficient P.

The switching device 2 has two coefficient inputs 201 and 202, two coefficient outputs 203 and 204, and also two control signal inputs 205 and 206. The coefficient outputs 203 and 204 are connected to the coefficient inputs 103 and 104, respectively, of the recursive digital filter 1. By way of AND-Gate circuits 207–210 and OR-gate circuits 211 and 212 the coefficient inputs 201 and 202 are connected to the coefficient outputs 203 and 204. A logic control signal $Q(t)$ which is offered to the control signal input 206 is applied to the AND-gate circuits 207 and 209, and a logic control signal output $\overline{Q}(t)$ offered to the control signal input 205 is applied to the AND-gate circuits 208 and 210. Herein $\phi(t)$ represents the logic inverted version of $Q(t)$. This switching device 2 operates as follows. Let it be assumed that $Q(t)=1$, then a filter coefficient applied to the coefficient input 201 is applied to the coefficient output 203 via AND-gate circuit 207 and OR-gate circuit 211 and thus to an input of the first multiplier device 107 via the coefficient input 103 of the digital filter 1. Simultaneously, a filter coefficient applied to the coefficient input 202 is applied to the coefficient output 204 via AND-gate circuit 209 and OR-gate circuit 212 and thus to an input of the second multiplier device 110, via the coefficient input 104 of the digital filter 1. The transfer function of digital filter 1 is now, for example, new equal to H(z). If $Q(t)=0$ and thus $\overline{Q}(t)=1$, a filter coefficient offered to the coefficient input 201 is applied to the second multiplier device 110 via AND-gate circuit 210 and OR-gate circuit 212. Simultaneously, a coefficient offered to the coefficient input 202 is applied to the first multiplier device 107 via AND-gate circuit 208 and OR-gate circuit 211. As a result thereof the transfer function of the digital filter 1 now becomes equal to $H'(z)=1/[H(z)]$.

The memory means 3 has coefficient outputs 301 and 302 and a control input 303. The coefficient outputs 301 and 302 are connected to the coefficient inputs 201 and 202, respectively, of the switching device 2. This memory means 3 further comprises a first memory field 304 for storing a first subgroup of filter coefficients and five second memory fields 305(1) ... 305(5) in each of which a second subgroup of filter coefficients is stored. Since the digital filter shown in FIG. 1 is a first-order filter and its transfer function has only one zero and only one pole, each subgroup of coefficients is formed by only one filter coefficient, and each memory field comprises only one memory location. The filter coefficient $a_{0,0}$ stored in the memory location of the memory field 304 is continuously applied to the coefficient input 201 of the switching device 2 via the coefficient output 301. The filter coefficient $b_{i,0}$, wherein $i=1, 2, 3, 4, 5$, which is stored in the memory location of the memory field 305 (i) can be applied to the coefficient input 202 of the switching device 2 via the coefficient output 302. The five second memory fields 305(1) to 305(5), inclusive, which may together be incorporated in a ROM, are individually addressable by means of an address coder 306 connected to these memory fields and to which address codes are applied which are applied to the control input 303.

As a starting point let it be assumed that the address codes 000; 001; 010, ... 111 are available. If now more particularly the address code 000 is offered, then it will be assumed that none of the memory fields 305(i) is addressed and that none of the coefficients $b_{i,0}$ is applied to the digital filter 1. If, however, the address code 001 is applied, then the filter coefficient $b_{1,0}$ is applied to the digital filter. If the address code 010 is offered then the filter coefficient $b_{2,0}$ is applied to the digital filter 1, and so on. In the present example only five of the eight possible 3-bit address codes are used to address the five second memory fields. In practice, the filter coefficients $b_{i,0}$ are chosen and arranged such that $b_{m,0}$ is less than $b_{m-1,0}$, wherein $m=2, 3, 4, 5$.

The above-mentioned address codes and the logic control signals $Q(t)$ and $\overline{Q}(t)$ are generated by a control circuit 4, which has an address code output 401 which is connected to the control input 303 of the memory means 3. In addition, it has first and second control signal outputs 402 and 403, which are connected to the control signal inputs 205 and 206, respectively, of the switching device 2. This control circuit 4 further comprises a 4-bit up-down counter 404 having an up-counting input "+" and a down-counting input "−". These two inputs are connected via respective switches 405 and 406 to the output of a clock pulse generator 407 which produces clock pulses with a frequency of, for example, 1 Hz or less. The switches 405 and 406 are manually operable as a result of which clock pulses can be applied to one of the two inputs of the counter which thus assumes a different one of the sixteen possible counting positions 0000; 0001; 0011; ..., 0111; 1001; ... 1111 in turn for each pulse. In these numbers the underlined bit represents the most significant bit (abbreviated to MSB). This most significant bit is available at an MSB-output 408 of counter 404 and is applied to the D-input of a D-flip-flop 410. The clock pulse input (or C-input) of this flip-flop is connected to the output of clock pulse generator 407 via a delay device 411. The time delay of this delay device 411 is chosen such that at its output a clock pulse occurs after the counting position has been changed and prior to the occurrence of a next clock pulse. The logic control signal $Q(t)$ occurs at the Q-output of this flip-flop 410, the logic value of this logic control signal being equal to MSB. At the $\overline{Q}$-output of flip-flop 410 the control signal $\overline{Q}(t)$ occurs and the logic value thereof is equal to the logic inverted value $\overline{MSB}$ of MSB. The signals $Q(t)$ and $\overline{Q}(t)$ are applied to the switching device 2 via the respective control signal outputs 403 and 402.

The three other bits of the counting positions form a code word which will be denoted a residual word hereinafter, which becomes available at an output 409 of counter 404 and is applied to two AND-gate circuits 412 and 413, which are controlled by the control signals $\overline{Q}(t)$ and $Q(t)$, respectively. The output of AND-gate circuit 413 is directly connected to an input of an OR-gate circuit 414 and the output of AND-gate circuit 412 is connected via an inverter circuit 415 to another input of the OR-gate circuit 414. The output of this OR-gate circuit 414 is connected to the address code output 401 of the control circuit 4.

If $Q(t)=1$ and the counter 404 supplies, for example, the residual word 010, then this word is directly applied as an address code to the address decoder 306 and the filter coefficient $b_{2,0}$ is applied to the multiplier device 110 in the recursive portion of the digital filter 1.

If in the event that $Q(t)=0$, and consequently $\overline{Q}(t)=1$ (i.e. MSB=0), and the residual word is equal to 101, this residual word is applied to the inverter circuit 415 which inverts each bit of this residual word and thus produces an inverted residual word 010 which is now applied via the OR-gate circuit 414 as an address code to the address decoder 306, in response to which the filter coefficients $b_{2,0}$ again appears at the coefficient output 302, which filter coefficient is now, however, applied to the multiplier device 107 in the non-recursive portion of the digital filter 1.

Figure 2A:
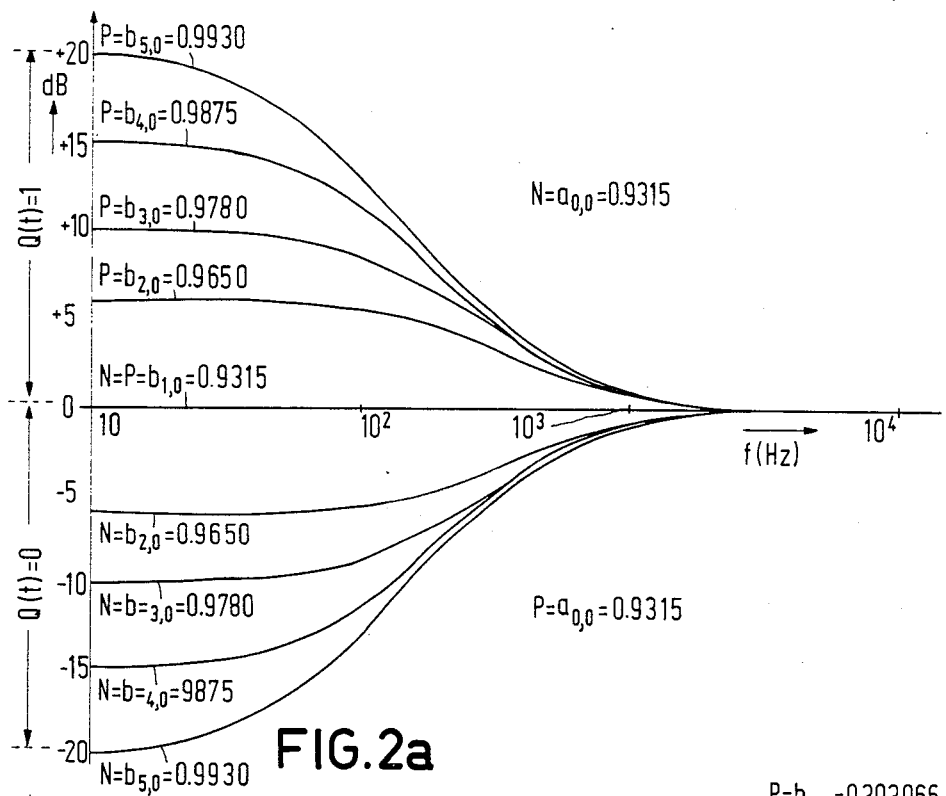
FIG. 2a shows a family of bass control characteristics which can be obtained with the tone control arrangement shown in FIG. 1.

FIG. 2a shows a family of transfer characteristics for bass control which is obtained by means of the tone control arrangement shown in FIG. 1, if the value of coefficient $a_{0,0}$ is chosen to be equal to 0.9315 and the values shown in the Figure are sequentially assigned to the filter coefficients $b_{i,0}$.

Figure 2B:
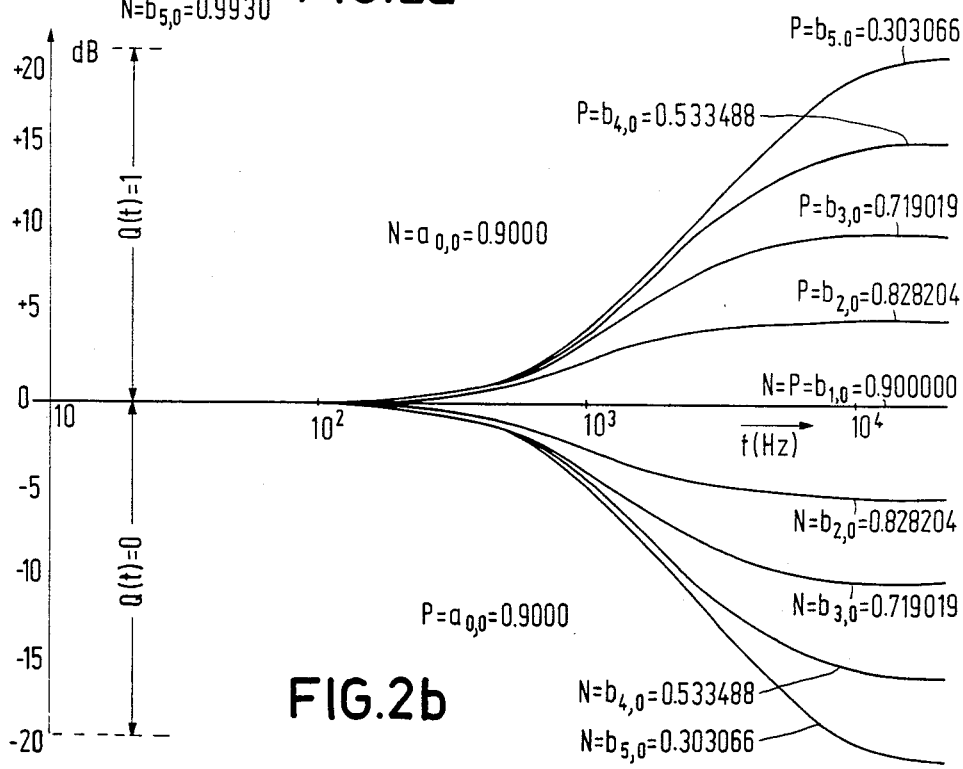
FIG. 2b shows a family of treble control characteristics which can be obtained with the tone control arrangement shown in FIG. 1.

FIG. 2b shows a family of transfer characteristics for treble control which is obtained by means of the tone control arrangement shown in FIG. 1, if the value of the coefficient $a_{0,0}$ is chosen to be equal to 0.9000 and the values shown in the Figure are sequentially assigned to the filter coefficients $b_{i,0}$.

Figure 3:
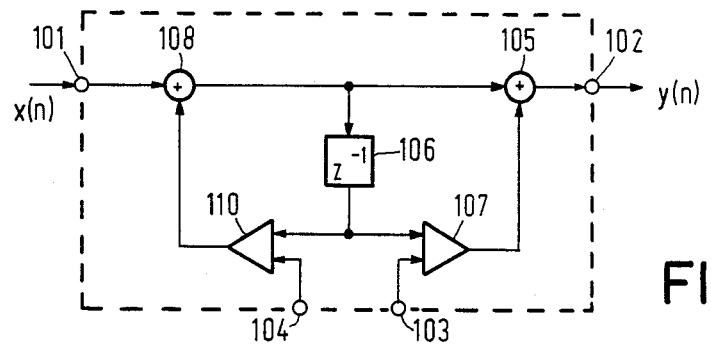
FIG. 3 shows a different implementation of a recursive digital filter for use in the tone control arrangement shown in FIG. 1.

As mentioned in the foregoing, the desired transfer function can be realized with digital filters of a widely different implementation. In the recursive digital filter 1 used in the tone control arrangement shown in FIG. 1, the recursive portion and the non-recursive portion are wholly separate from each other. It is, however, alternatively possible to implement the recursive digital filter in such a way that certain elements are simultaneously part of both the recursive and the non-recursive portions. An example of a recursive digital filter implemented in such a manner is shown for the sake of completeness in FIG. 3. This recursive digital filter has a signal input 101, a signal output 102 and coefficient inputs 103 and 104. In addition, this filter comprises the two adders 105 and 108 and the two multiplier devices 107 and 110. In this embodiment of the recursive digital filter there is, however, only one delay device 106. The recursive portion of the filter is now formed by the circuit comprising the elements 108, 106 and 110, and the non-recursive portion is formed by the circuit comprising the elements 105, 106 and 107.

In the embodiments of the digital tone control arrangement shown in FIG. 1, a first-order recursive digital filter is used, so that this tone control arrangement is particularly suitable for bass or treble control. If, however, this tone control arrangement must be employed for equalizing purposes, then this recursive digital filter must be at least of the second order, so that its transfer function has at least two zeros and two poles.

Figure 4:
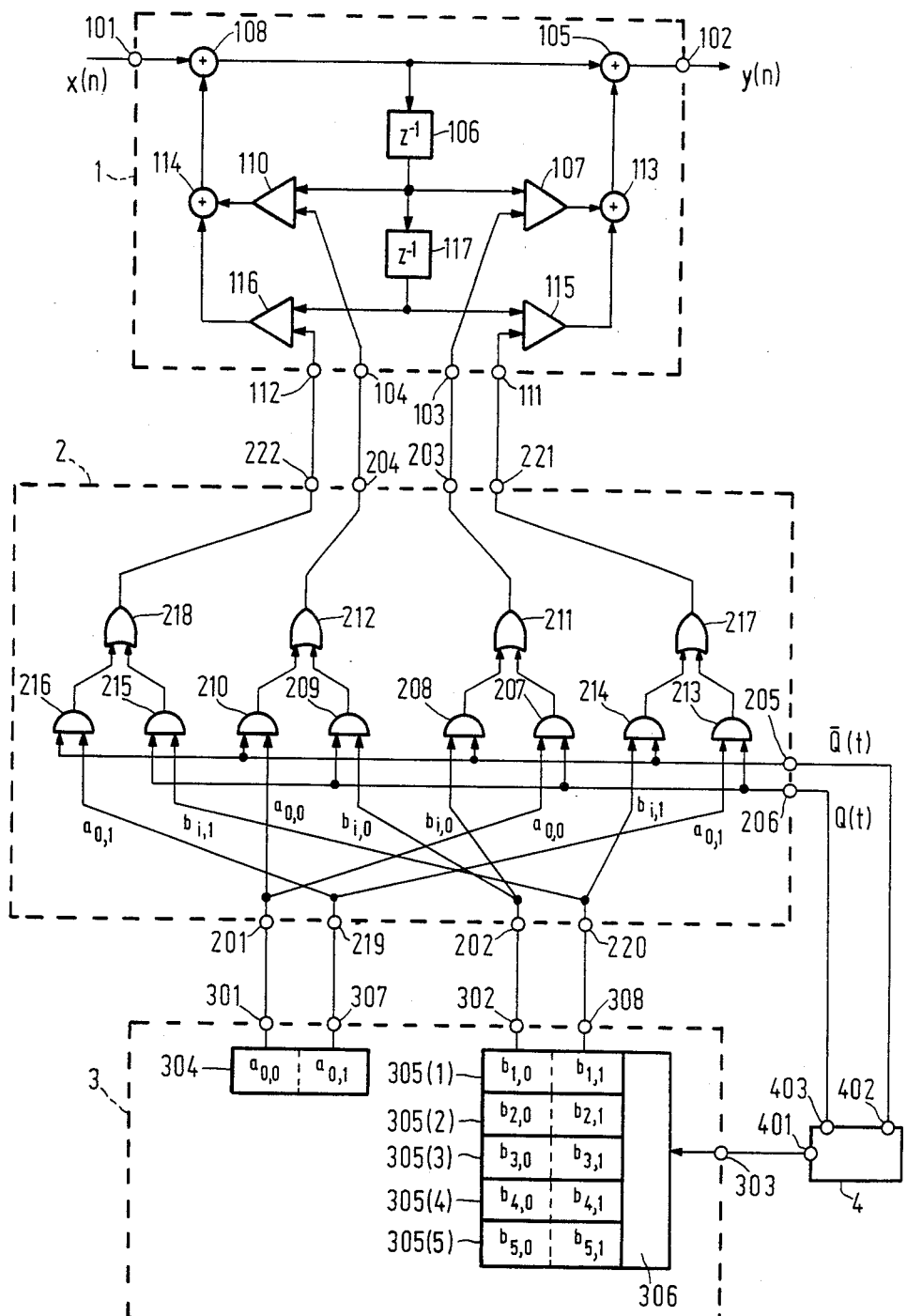
FIG. 4 shows a second embodiment of a digital tone control arrangement which is particularly suitable for, for example, equalizing purposes.

FIG. 4 shows an embodiment of the digital tone control arrangement in which a second-order recursive digital filter 1 is employed. This tone control arrangement corresponds to a very great extent to the arrangement shown in FIG. 1, but differs therefrom in the following respects:

(1) In addition to the signal input 101, the signal output 102, the coefficient outputs 103 and 104, the adders 105 and 108, the delay device 106 and the multiplier devices 107 and 110, the second-order recursive digital filter 1 further incorporates coefficient inputs 111 and 112, adders 113 and 114, multiplier devices 115 and 116 and a delay device 117. The recursive digital filter shown in FIG. 4 has a well-known construction and comprises a recursive portion incorporating the elements 108, 106, 117, 110, 116, 114 and a non-recursive portion incorporating the elements 106, 117, 107, 115, 105, 103.

(2) The switching device 2 is now of a dual construction and in addition to the original switching circuit already shown in FIG. 1, which is now formed by the AND-gate circuits 207–210 and the OR-gate circuits 211 and 212, it now comprises a second switching circuit of the same construction as the original switching circuit and formed by AND-gate circuits 213–216 and OR-gate circuits 217 and 218. This second switching circuit connects coefficient inputs 219 and 220 to coefficient outputs 221 and 222. The coefficient outputs 203 and 204 are again connected to the coefficient inputs 103 and 104, respectively, of the digital filter 1 and the coefficient outputs 221 and 222 are connected to the coefficient inputs 111 and 112, respectively, of this digital filter.

(3) In addition to the coefficient outputs 301 and 302 the memory means 3 now also has coefficient outputs 307 and 308, which are connected to the coefficient inputs 219 and 220, respectively, of the switching device 2. Since the filter shown in FIG. 4 is a second-order digital filter and its transfer function has not only two zero points but also two poles, each subgroup of filter coefficients now consists of two filter coefficients. More specifically, the first subgroup of the filter coefficient is now formed by $a_{0,0}$ and $a_{0,1}$ which are both stored in a memory location of the first memory field 304, these filter coefficients $a_{0,0}$ and $a_{0,1}$ being continuously applied to the coefficient outputs 301 and 307, respectively. Each second subgroup of filter coefficients is now also formed by two filter coefficients, namely by $b_{i,0}$ and $b_{i,1}$, wherein i=1, 2, 3, 4, 5 which are each stored in a memory location of the second memory field 304 (i) and can be applied to the coefficient outputs 302 and 308, respectively. In the manner as described with reference to FIG. 1, each of these two memory fields is also addressable by means of the address coder 306 to which address codes are applied which can be generated by the control circuit 4, which may be of a similar construction to the control circuit shown in FIG. 1.

What is claimed is:

1. A digital tone control arrangement for controlling the amplitude and the phase of the frequency components of an audio signal which is available in the digital form, the frequency components being located in a predetermined frequency band, which arrangement comprises:

a recursive digital filter to which a digital audio signal is applied, which has a recursive portion and a non-recursive portion connected thereto, each portion receiving filter coefficients which are stored in a memory means and which arrangement is characterized in that:

the memory means is divided into a first memory field for storing only one single first subgroup of filter coefficients and into a number of second memory fields in each of which a respective second subgroup of filter coefficients is stored;

means are provided for applying the first subgroup of filter coefficients stored in the first memory field either to the non-recursive portion or to the recursive portion and for applying a second subgroup of the filter coefficients to that portion to which the first subgroup of filter coefficients is not applied.

2. In recursive digital filter means receiving a digital audio signal and furnishing a filtered digital audio signal corresponding to said input digital audio signal multiplied by a selected one of a plurality of transfer functions, said digital recursive filter means having a recursive portion receiving a selected recursive filter coefficient and a non-recursive portion connected to said recursive portion and receiving a selected non-recursive filter coefficient for creating said selected one of said plurality of transfer functions in conjunction with said recursive portion, apparatus for furnishing said recursive and non-recursive filter coefficients, comprising memory means having a first memory field storing a first filter coefficient, and a second memory field storing a second filter coefficient; and logic circuit means connected between said memory means and said recursive digital filter means for applying said first filter coefficient to said non-recursive portion and said second filter coefficient to said recursive portion to constitute said non-recursive and recursive filter coefficients, respectively, or alternatively, applying said first filter coefficient to said recursive and said second filter coefficient to said non-recursive filter portion, whereby a first or second transfer function is created with a single first and a single second filter coefficient.

3. Recursive digital filter means as set forth in claim 2, wherein said memory means has a plurality of second memory fields each storing a second filter coefficient different from the other second filter coefficients; and wherein said logic circuit means further comprises means for selecting one of said second coefficients for application to said logic circuit means.

4. Recursive digital filter means as set forth in claim 2, wherein said recursive filter means is a second order filter having a pair of recursive filter coefficients and a pair of non-recursive filter coefficients; and wherein said first memory field stores a pair of first coefficients and said second memory field stores a pair of second coefficients.

5. Recursive digital filter means as set forth in claim 2, wherein said logic circuit means comprises a first and second AND gate respectively applying said first filter coefficient to said no-recursive and recursive portion when switched to the conductive state, and a third and fourth AND gate for, respectively, applying said second filter coefficient to said non-recursive and recursive portions when in a conducting state, and means for selectively switching said first and fourth or third and second AND gate to said conductive state.

6. Recursive digital filter means as set forth in claim 5, wherein said selective switching means is a flipflop.

* * * * *